(12) United States Patent
Nakajima et al.

(10) Patent No.: US 10,383,220 B2
(45) Date of Patent: Aug. 13, 2019

(54) CERAMIC SUBSTRATE AND METHOD FOR PRODUCTION THEREOF

(71) Applicant: HITACHI METALS, LTD., Tokyo (JP)

(72) Inventors: Hirokazu Nakajima, Mishima-gun (JP); Kohei Sakaguchi, Mishima-gun (JP)

(73) Assignee: HITACHI METALS, LTD., Tokyo (JP)

( * ) Notice: Subject to any disclaimer, the term of this patent is extended or adjusted under 35 U.S.C. 154(b) by 116 days.

(21) Appl. No.: 15/468,697

(22) Filed: Mar. 24, 2017

(65) Prior Publication Data

US 2017/0280559 A1    Sep. 28, 2017

(30) Foreign Application Priority Data

Mar. 25, 2016    (JP) .................................. 2016-062246

(51) Int. Cl.
    *C04B 35/195*    (2006.01)
    *B32B 18/00*    (2006.01)
    (Continued)

(52) U.S. Cl.
    CPC .......... *H05K 1/0306* (2013.01); *B28B 11/243* (2013.01); *B32B 18/00* (2013.01); *C04B 35/111* (2013.01); *C04B 35/195* (2013.01); *C04B 35/6263* (2013.01); *C04B 35/6264* (2013.01); *C04B 35/62615* (2013.01);
    (Continued)

(58) Field of Classification Search
    CPC ..... C04B 35/195; C04B 41/52; C04B 41/522; C04B 41/524; C04B 41/526; B32B 18/00; H05K 1/0306
    See application file for complete search history.

(56) References Cited

U.S. PATENT DOCUMENTS 4,650,923 A * 3/1987 Nishigaki ............. C04B 35/111
                                                          174/255
4,861,646 A * 8/1989 Barringer ............. C03C 14/004
                                                          428/210

(Continued)

FOREIGN PATENT DOCUMENTS

JP    59-194493 A    11/1984
JP    01-312896 A    12/1989

(Continued)

OTHER PUBLICATIONS

Song et al. "Phase composition and microwave dielectric properties of SrTiO3 modified Mg2Al4Si5O18 cordierite ceramics", Journal of Alloys and Compounds, 2015 (Year: 2015).*

(Continued)

*Primary Examiner* — Z. Jim Yang
(74) *Attorney, Agent, or Firm* — Sughrue Mion, PLLC

(57) ABSTRACT

A ceramic substrate and a method for production thereof are provided, in which the ceramic substrate includes a composite of: a first ceramic layer including Sr anorthite and $Al_2O_3$ or an oxide dielectric with a dielectric constant higher than that of $Al_2O_3$; and a second ceramic layer including Sr anorthite and cordierite and having a dielectric constant lower than that of the first ceramic layer.

9 Claims, 1 Drawing Sheet
(1 of 1 Drawing Sheet(s) Filed in Color)

(51) Int. Cl.
  *H05K 1/03* (2006.01)
  *B28B 11/24* (2006.01)
  *C04B 37/00* (2006.01)
  *H05K 1/02* (2006.01)
  *H05K 3/46* (2006.01)
  *C04B 35/111* (2006.01)
  *C04B 35/626* (2006.01)
  *C04B 35/634* (2006.01)
  *C04B 35/638* (2006.01)
  *H05K 1/16* (2006.01)

(52) U.S. Cl.
  CPC .. *C04B 35/62625* (2013.01); *C04B 35/62655* (2013.01); *C04B 35/62675* (2013.01); *C04B 35/638* (2013.01); *C04B 35/6342* (2013.01); *C04B 35/63416* (2013.01); *C04B 37/001* (2013.01); *H05K 1/024* (2013.01); *H05K 3/4629* (2013.01); *H05K 3/4644* (2013.01); *C04B 2235/3201* (2013.01); *C04B 2235/3213* (2013.01); *C04B 2235/3236* (2013.01); *C04B 2235/3244* (2013.01); *C04B 2235/3262* (2013.01); *C04B 2235/3263* (2013.01); *C04B 2235/3267* (2013.01); *C04B 2235/3281* (2013.01); *C04B 2235/3298* (2013.01); *C04B 2235/3409* (2013.01); *C04B 2235/3445* (2013.01); *C04B 2235/36* (2013.01); *C04B 2235/442* (2013.01); *C04B 2235/5409* (2013.01); *C04B 2235/5436* (2013.01); *C04B 2235/602* (2013.01); *C04B 2235/604* (2013.01); *C04B 2235/6562* (2013.01); *C04B 2235/9607* (2013.01); *C04B 2237/341* (2013.01); *C04B 2237/343* (2013.01); *C04B 2237/704* (2013.01); *H05K 1/0271* (2013.01); *H05K 1/162* (2013.01); *H05K 1/165* (2013.01); *H05K 2201/068* (2013.01); *H05K 2203/06* (2013.01)

(56) References Cited

U.S. PATENT DOCUMENTS

| | | | | |
|---|---|---|---|---|
| 4,992,318 A * | 2/1991 | Gadkaree | ........... | B32B 5/26 428/114 |
| 5,642,868 A * | 7/1997 | Talmy | ........... | C04B 35/195 244/121 |
| 5,786,288 A * | 7/1998 | Jean | ........... | C03C 4/16 428/433 |
| 6,120,906 A * | 9/2000 | Terashi | ........... | C03C 14/004 257/E23.009 |
| 6,121,174 A * | 9/2000 | Yokoi | ........... | C03C 10/0045 428/469 |
| 6,174,829 B1 * | 1/2001 | Jean | ........... | C03C 14/00 156/89.12 |
| 6,232,251 B1 * | 5/2001 | Terashi | ........... | C03C 4/16 257/E23.009 |
| 6,348,424 B1 * | 2/2002 | Hazeyama | ........... | C03B 19/06 156/89.11 |
| 6,417,461 B1 | 7/2002 | Hirahara et al. | | |
| 2002/0098965 A1 * | 7/2002 | Terashi | ........... | C03C 10/0045 501/5 |
| 2003/0113554 A1 * | 6/2003 | Umayahara | ........... | B32B 17/06 428/446 |
| 2003/0118842 A1 * | 6/2003 | Moriya | ........... | C03C 14/004 428/428 |
| 2003/0224921 A1 * | 12/2003 | Bedard | ........... | C03C 14/004 501/32 |
| 2005/0126682 A1 * | 6/2005 | Nishide | ........... | B32B 18/00 156/89.11 |
| 2005/0158534 A1 * | 7/2005 | Tabuchi | ........... | B01D 39/2075 428/304.4 |
| 2005/0186407 A1 * | 8/2005 | Mori | ........... | B32B 18/00 428/210 |
| 2005/0214516 A1 * | 9/2005 | Yoshikawa | ........... | C04B 35/117 428/209 |
| 2005/0221068 A1 * | 10/2005 | Nonoue | ........... | B32B 18/00 428/209 |
| 2006/0100087 A1 * | 5/2006 | Fukuta | ........... | C03C 3/062 501/125 |
| 2006/0194032 A1 * | 8/2006 | Furuse | ........... | B32B 18/00 428/210 |
| 2008/0253954 A1 * | 10/2008 | Moriya | ........... | B82Y 30/00 423/331 |
| 2009/0056380 A1 * | 3/2009 | Beall | ........... | C03B 32/02 65/33.9 |
| 2009/0061178 A1 * | 3/2009 | Sugimoto | ........... | C03C 14/004 428/210 |
| 2010/0101702 A1 * | 4/2010 | Choi | ........... | B32B 18/00 156/89.12 |
| 2010/0224396 A1 * | 9/2010 | Nomiya | ........... | H05K 3/4629 174/258 |
| 2010/0311563 A1 * | 12/2010 | Furuse | ........... | C04B 35/111 501/125 |
| 2011/0117360 A1 * | 5/2011 | Izumi | ........... | C04B 35/16 428/329 |
| 2012/0015198 A1 * | 1/2012 | Masukawa | ........... | B32B 18/00 428/446 |
| 2012/0282469 A1 * | 11/2012 | Nahas | ........... | C04B 35/111 428/402 |
| 2014/0001485 A1 * | 1/2014 | Beall | ........... | C03C 10/0036 257/76 |
| 2014/0071645 A1 * | 3/2014 | Glanz | ........... | C03C 14/00 361/771 |
| 2014/0138724 A1 * | 5/2014 | Hitomi | ........... | H01L 33/486 257/98 |
| 2014/0301053 A1 * | 10/2014 | Iida | ........... | H05K 3/4629 361/760 |
| 2014/0338296 A1 * | 11/2014 | Backhaus-Ricoult | ........... | B01D 46/2429 55/523 |
| 2014/0347782 A1 * | 11/2014 | Fujita | ........... | B32B 18/00 361/301.4 |
| 2015/0030830 A1 * | 1/2015 | Adachi | ........... | H01B 3/12 428/212 |
| 2015/0218053 A1 * | 8/2015 | Kobayashi | ........... | B32B 18/00 428/212 |
| 2016/0264470 A1 * | 9/2016 | Liu | ........... | C01B 33/24 |
| 2018/0044244 A1 * | 2/2018 | Sugimoto | ........... | C04B 35/195 |

FOREIGN PATENT DOCUMENTS

| | | | | |
|---|---|---|---|---|
| JP | 2001-284818 A | | 10/2001 | |
| JP | 2006001755 A | * | 1/2006 | ........... C03C 8/04 |
| WO | WO-2009057878 A1 | * | 5/2009 | ........... C03C 8/04 |
| WO | 2010/110201 A1 | | 9/2010 | |

OTHER PUBLICATIONS

Machine translation of JP 2006/001755A, obtained from EspaceNet (Year: 2019).*

* cited by examiner

CERAMIC SUBSTRATE AND METHOD FOR PRODUCTION THEREOF

BACKGROUND OF THE INVENTION

Field of the Invention

The invention relates to a ceramic substrate suitable for: circuit boards for use in various industrial devices such as motors, vehicle mounted devices such as engine control units, or home electric appliances such as refrigerators, air conditioners, and televisions; circuit boards for use in various electronic devices including mobile communications devices such as cellular phones and smart phones; and high frequency parts such as high frequency filters and high frequency antennas. The invention also relates to a method for producing such a ceramic substrate.

Description of the Related Art

In recent years, semiconductor LSIs, chip parts, and other parts have decreased in size, thickness, and inter-terminal pitch. Therefore, ceramic substrates on which these parts are to be mounted have also been required to be smaller, thinner, and higher in precision. Conventionally, alumina is mainly used as a dielectric ceramic for forming ceramic substrates. Since the sintering temperature for alumina is as high as 1,300 to 1,600° C., high melting point metals such as W and Mo are used as electrode materials for wiring, such as transmission lines, on ceramic substrates. Unfortunately, W and Mo have high electric resistivity and high loss in the high frequency region and thus cannot be used for high frequency parts or parts requiring low resistance wiring. Thus, low resistance metals such as Cu, Ag, and Au have come into use as electrode materials, and dielectric ceramics capable of being sintered at a low temperature of about 800 to 1,000° C. simultaneously with low melting point metals such as Cu, Ag, and Au (low temperature co-fired ceramics) have come into use.

On the other hand, parts are downsized by forming built-in passive elements such as inductors and capacitors in ceramic substrates and by forming built-in transmission lines of the electrode materials on ceramic substrates. When built-in capacitors are formed, the use of dielectric ceramics with a higher dielectric constant allows the capacitors to have relatively higher capacitance. However, the use of dielectric ceramics with a higher dielectric constant can cause delay of high frequency signal transmission in transmission lines and can often increase crosstalk due to the stray capacitance generated between lines. Thus, Patent Document 1 proposes that a green sheet for forming a low dielectric constant ceramic layer and a green sheet for forming a high dielectric constant ceramic layer are stacked and simultaneously fired to form a low dielectric constant ceramic layer as a transmission line and to form a high dielectric constant ceramic layer as a capacitor dielectric. Patent Document 2 also discloses that a low temperature co-fired ceramic is used to form a ceramic substrate made of a composite of ceramic layers with different dielectric constants (hereinafter, such a ceramic substrate will also be referred to as a composite ceramic substrate).

For example, Patent Document 1 discloses that a dielectric ceramic composed mainly of $La_2O_3 \cdot 2TiO_2$ is used to form the high dielectric constant ceramic layer while a dielectric ceramic composed mainly of $Al_2O_3$ is used to form the low dielectric constant ceramic layer. Patent Document 2 discloses that a Pb-based perovskite Type dielectric ceramic is used to form the high dielectric constant ceramic layer while a $BaO-Al_2O_3-SiO_2$ dielectric ceramic is used to form the low dielectric constant ceramic layer. As mentioned above, dielectric ceramics with significantly different compositions have been principally used, depending on dielectric constant, for composite ceramic substrates.

In order for dielectric ceramics with significantly different compositions to be bonded strongly without delamination or cracking by co-firing, it is necessary to select dielectric ceramics whose thermal expansion coefficients or contraction behaviors during firing are close to each other, and it is also necessary to take into account how to suppress fluctuations in dielectric characteristics such as dielectric constant at the bonded interface between the dielectric ceramics, which would otherwise be caused by mutual diffusion of components.

Patent Document 3 discloses that when first and second insulating layers including dielectric ceramics with different dielectric constants are used to form a composite ceramic substrate, the presence of $(Mg,Ti)_2(BO_3)O$ as a common crystal phase in the dielectric ceramics with different dielectric constants allows them to have close contraction behaviors during firing and makes it possible to suppress cracking, delamination, or warpage in the composite ceramic substrate.

PRIOR ART DOCUMENTS

Patent Documents

Patent Document 1: JP-A-59-194493
Patent Document 2: JP-A-01-312896
Patent Document 3: JP-A-2001-284818
Patent Document 4: WO 2010/110201 A

SUMMARY OF THE INVENTION

According to Patent Document 3, however, each insulating layer (ceramic layer) contains $B_2O_3$, which is used as a component to form the common crystal phase $(Mg, Ti)_2(BO_3)O$. $B_2O_3$ reduces the firing temperature of dielectric ceramics and increases the amount of produced crystal phase $(Mg,Ti)_2(BO_3)O$, depending on its content. $B_2O_3$ raises a problem in that as the amount of the crystal phase $(Mg,Ti)_2(BO_3)O$ increases, the Q value decreases, though the first and second ceramic layers including dielectric ceramics with different dielectric constants become strongly bonded to each other.

In addition, boron (B) may cause problems with manufacturing processes, such as damage by B to firing furnace materials and dissolution of B in water or an alcohol and segregation of B during drying in the process of forming the inorganic compositions into ceramic sheets. B may also reduce the Q value of dielectric ceramics. Therefore, it is necessary not to use B or to use B as little as possible.

On the other hand, Patent Document 4 discloses that each ceramic layer contains an $AAl_2Si_2O_8$ phase (A is an element of at least one of Ca and Sr) as a common crystal phase. However, the ceramic layers disclosed in Patent Document 4 contain $B_2O_3$ for improving sinterability, which can cause the problems mentioned above, and thus has room for improvement.

It is therefore an object of the invention to provide a ceramic substrate that includes a composite of ceramic layers with different dielectric constants, has strong bonding between the ceramic layers with less cracking and delamination, and has a B content reduced to a low level. It is another object of the invention to provide a method for producing such a ceramic substrate.

As a result of intensive studies to solve the problems, the inventor has accomplished the invention based on findings that the objects can be achieved by using cordierite for a low dielectric constant layer and forming Sr anorthite as a common crystal phase in the production of a ceramic substrate including dielectric ceramic layers with different dielectric constants.

Specifically, the invention is directed to a ceramic substrate including: a first ceramic layer including Sr anorthite and $Al_2O_3$ or an oxide dielectric with a dielectric constant (relative permittivity) higher than that of $Al_2O_3$; and a second ceramic layer including Sr anorthite and cordierite and having a dielectric constant lower than that of the first ceramic layer. Although described in detail later, the first and second ceramic layers according to the invention contain Sr anorthite as a common crystal phase, which makes it possible not to use B or to reduce the use of B to a low level. Also in the invention, the presence of Sr anorthite as a common phase allows the respective layers to have close contraction behaviors during firing, which makes it possible to obtain a ceramic substrate having strong bonding between the layers with less cracking and delamination at the bonded interface between the layers.

Sr anorthite (typically $SrAl_2Si_2O_8$) itself has a high Q value. Therefore, Sr anorthite can provide an fQ product (also called fQ value, in which f is resonance frequency) of more than 10 THz. Sr anorthite has a dielectric constant as low as about 6.5. Therefore, the second ceramic layer with a lower dielectric constant can include Sr anorthite as a main phase. In addition, the first ceramic layer with a higher dielectric constant can include Sr anorthite and $Al_2O_3$ or an oxide dielectric with a dielectric constant higher than that of $Al_2O_3$. These features make it possible to obtain a ceramic substrate in which the first and second ceramic layers formed with different dielectric constants are strongly bonded with less cracking and delamination at the bonded interface between the first and second ceramic layers. In addition, $Al_2O_3$, which has a dielectric constant higher than that of Sr anorthite, or an oxide dielectric with a dielectric constant higher than that of $Al_2O_3$ can be selected as the main phase of the first ceramic layer, which makes it easy to control the dielectric constant of the first ceramic layer. In general, the higher the dielectric constant, the lower the Q value. However, the presence of Sr anorthite as a crystal phase can reduce the degradation of the fQ product.

Cordierite (typically, $2MgO.2Al_2O_3.5SiO_2$) has a dielectric constant of about 5. Therefore, the second ceramic layer containing cordierite can have a relatively low dielectric constant.

In the ceramic substrate of the invention, the absolute value of the difference between the thermal expansion coefficients of the first ceramic layer and the second ceramic layer is preferably $1 \times 10^{-6}/°$ C. or less. When semiconductors and chip parts are mounted on the ceramic substrate, rapid thermal changes can be induced by reflow soldering or other processes. In the ceramic substrate, however, the difference in thermal expansion coefficient between the first and second ceramic layers is kept low, so that delamination and cracking can be suppressed even when thermal expansion difference-induced stress occurs at the bonded interface between the first and second ceramic layers.

In the invention, when B is used for the first or second ceramic layer, the content of B is preferably 0.5% by mass or less in terms of $B_2O_3$. Reducing the use of B to a low level makes it possible to prevent problems with manufacturing processes, such as damage by B to firing furnace materials, dissolution of B in water or an alcohol and segregation of B during drying in the process of forming the inorganic compositions into ceramic sheets.

In the ceramic substrate of the invention, the first ceramic layer preferably has a dielectric constant of 7 or more, and the second ceramic layer preferably has a dielectric constant of 6.5 or less. The first and second ceramic layers both contain Sr anorthite. The first ceramic layer contains an oxide dielectric with a dielectric constant higher than that of Sr anorthite while the second ceramic layer contains cordierite with a dielectric constant lower than that of Sr anorthite. Sr anorthite, common to the first and second ceramic layers, has a dielectric constant of about 6.5, and the first ceramic layer further contains an oxide dielectric with a relatively high dielectric constant, while the second ceramic layer contains, as another crystal phase, an oxide dielectric with a relatively low dielectric constant. Therefore, the dielectric constant of the second ceramic layer can be successfully set lower than that of the first ceramic layer. The dielectric constant can be controlled by selecting the type and content of the oxide dielectric, which determines, together with Sr anorthite, the dielectric content. Since sinterability can be degraded by increasing the content of the oxide dielectric, the dielectric constant of the first ceramic layer is preferably controlled to 30 or less, more preferably 25 or less, and the dielectric constant of the second ceramic layer is preferably controlled to 5.2 or more, more preferably 5.5 or more.

The first ceramic layer preferably contains, as a main phase, $Al_2O_3$ or an oxide dielectric with a dielectric constant higher than that of $Al_2O_3$, and the second ceramic layer preferably contains Sr anorthite as a main phase. This feature allows the first and second ceramic layers to have significantly different dielectric constants while providing strong bonding at the bonded interface between the first and second ceramic layers. The first ceramic layer preferably contains 40 to 50% by mass of Al in terms of $Al_2O_3$, 30 to 40% by mass of Si in terms of $SiO_2$, and 10 to 20% by mass of Sr in terms of $SrCO_3$. This feature ensures that a ceramic layer having crystal phases of Sr anorthite and $Al_2O_3$ can be formed by the production method described below. In addition, the dielectric constant can be controlled by increasing the $Al_2O_3$ content to a level higher than that in the stoichiometric composition of Sr anorthite ($Al_2O_3$ 31.30% by mass, $SiO_2$ 36.89% by mass, SrO 31.81% by mass).

The invention is also directed to a method for producing a ceramic substrate, the method including the steps of : stacking a layer of a first insulating material and a layer of a second insulating material to form a laminate, wherein the first insulating material includes a powder of a mixture of at least glass capable of forming Sr anorthite; and $Al_2O_3$ or an oxide dielectric with a dielectric constant higher than that of $Al_2O_3$, and the second insulating material includes a powder of a mixture of at least glass capable of forming Sr anorthite; and cordierite; and firing the laminate to form Sr anorthite. This method allows the ceramic layers with different dielectric constants to be strongly bonded with less cracking and delamination. This method also provides improved sinterability because the glass capable of forming Sr anorthite functions as a sintering aid, which makes it possible to produce a ceramic substrate with a lower B content even when B is used.

Specifically, in the firing step of the ceramic substrate producing method of the invention, Sr anorthite is formed as a crystal phase common to the first and second ceramic layers as mentioned above. This makes it easy to allow the first and second ceramic layers to have close firing start temperatures, close contraction behaviors during firing, and a smaller difference in thermal expansion coefficient. In the resulting ceramic substrate, the first and second ceramic layers are strongly bonded with less delamination and cracking at the bonded interface between the first and second ceramic layers. Since cordierite has a dielectric constant of about 4.8, the dielectric constant of the second ceramic layer can be reduced depending on the amount of cordierite. Cordierite itself is preferably mixed to form the second insulating material.

In the ceramic substrate producing method of the invention, the first insulating material is preferably a calcined product obtained by calcining a mixture of oxides or carbonates of Al, Si, and Sr or preferably a calcined product mixture obtained by mixing the calcined product and an oxide dielectric with a dielectric constant higher than that of $Al_2O_3$, and the second insulating material is preferably a calcined product mixture obtained by mixing a cordierite powder and a calcined product obtained by calcining a mixture of oxides or carbonates of Al, Si, and Sr.

The ceramic substrate producing method of the invention makes it possible to obtain the ceramic substrate of the invention. In the ceramic substrate obtained by the method of the invention, the respective ceramic layers contain Sr anorthite as a common phase, which makes it possible to obtain strong bonding between the respective layers with less delamination and cracking at the bonded interface between the respective layers.

The first or second insulating material may contain a sintering aid such as $Bi_2O_3$, CuO, or $Mn_3O_4$ for assisting low temperature sintering of the dielectric ceramic as long as it does not degrade the dielectric characteristics. It will be understood that the first and second insulating materials may contain inevitable impurities.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE PREFERRED EMBODIMENTS

The ceramic substrate of the invention and the method for production thereof will be described with reference to the drawings. Note that components unnecessary for the description are omitted from some or all of the drawings and that some components are illustrated, for example, in an enlarged or reduced manner to facilitate the description. Terms indicating positional relationships, such as "upper" and "lower," are used only to make the description easy to understand and are not intended to limit the features of the invention at all.

Figure 1:
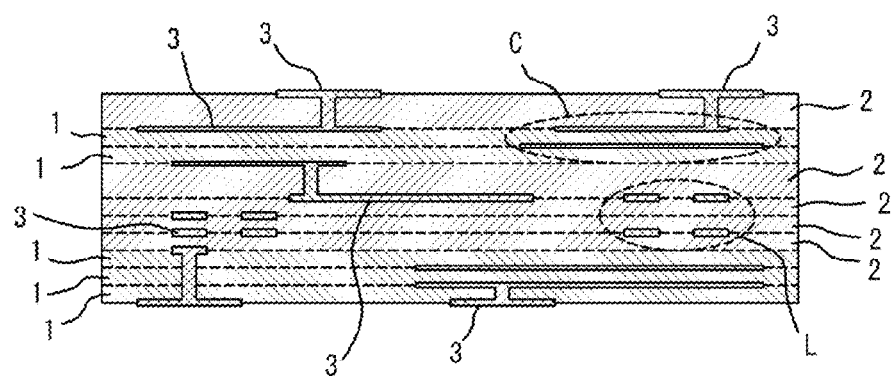
FIG. 1 is a cross-sectional view illustrating an embodiment of the ceramic substrate of the invention.

Hereinafter, the ceramic substrate of the invention will be described. As illustrated in FIG. 1, the ceramic substrate of the invention includes a first ceramic layer 1 and a second ceramic layer 2, in which a plurality of ceramic layers may be provided for each type. The first and second ceramic layers 1 and 2 have different dielectric constants. In general, each ceramic layer is provided with a wiring pattern 3 and optionally a via for electrical interlayer connection. In the illustrated example, wiring patterns 3 for electrodes are provided on both sides of the first ceramic layer 1 with a higher dielectric constant to form a capacitor C. In addition, wiring patterns are provided between the second ceramic layers 2 to form an interconnection line, an inductor L, and other components. In the ceramic substrate of the invention, the first and second ceramic layers 1 and 2 contain Sr anorthite as a common phase. The ceramic substrate also includes a stack of ceramic layers having different dielectric constants, in which the first ceramic layer 1 has a relatively high dielectric constant while the second ceramic layer 2 has a relatively low dielectric constant. The order of stacking the respective ceramic layers and the number of the stacked ceramic layers may be appropriately designed depending on the intended use of the ceramic substrate and taking into account the circuit to be formed on the substrate, the desired mechanical strength and other physical properties, and other factors.

The first ceramic layer can be formed by firing a first insulating material that includes a powder of a mixture of at least glass capable of forming Sr anorthite; and $Al_2O_3$ or an oxide dielectric with a dielectric constant higher than that of $Al_2O_3$. Any oxides, carbonates, or other materials capable of forming, for example, $Mg_2SiO_4$, $ZrO_2$, $BaTiO_3$, or $TiO_2$ upon firing as described below may be used as raw materials for the oxide dielectric with a dielectric constant higher than that of $Al_2O_3$. Such raw materials may be added simultaneously with raw materials capable of producing Sr anorthite-forming glass. In addition, $TiO_2$ may also be used to control the temperature characteristic τf of the resonance frequency of the dielectric ceramic.

As used herein, the term "Sr anorthite" refers to a material typically represented by the composition $SrAl_2Si_2O_8$. The term "Sr anorthite" is also intended to include materials in which the Sr atom is partially substituted with another atom. Sr anorthite can be identified, for example, by observing the X-ray diffraction peak of an $SrAl_2Si_2O_8$ phase in X-ray diffractometry (XRD) as described below.

The glass capable of forming Sr anorthite can be obtained by calcining raw materials including oxides or carbonates of Al, Si, and Sr as described below. Oxides and carbonates may be interchangeably used as raw materials because $CO_2$ is dissociated (decarbonized) by calcination even when carbonates are used. It will be understood that the Sr anorthite may contain impurities derived from raw materials (inevitable impurities).

The contents of Al, Si, and Sr in the first insulating material should be such that $SrAl_2Si_2O_8$ can be formed by firing the first insulating material and the first insulating material can be sintered at a low temperature of 1,000° C. or less to form a product with a sufficient sintered density. From these points of view, the first insulating material preferably contains 40 to 50% by mass in terms of $Al_2O_3$, 30 to 40% by mass in terms of $SiO_2$, and 10 to 20% by mass in terms of $SrCO_3$, based on 100% by mass of the total amount of the first insulating material. The composition of the first insulating material used to form the first ceramic layer should be so designed that the content of $Al_2O_3$ as a raw material is higher than that in the stoichiometric composition of $SrAl_2Si_2O_8$ ($Al_2O_3$ 31.30% by mass, $SiO_2$ 36.89% by mass, SrO 31.81% by mass), so that the resulting first ceramic layer can contain $Al_2O_3$ and $SrAl_2Si_2O_8$. When the first insulating material contains Ti, the content of Ti in terms of $TiO_2$ is preferably 0 to 10% by mass based on 100% by mass of the total amount of the first insulating material in view of temperature characteristic τf.

In addition to the main components mentioned above, the first insulating material may also contain, for example, Bi, Na, K, Cu, or Mn as a sub-component.

In order to reduce the softening point of the glass and make sintering possible at lower temperature, the first insulating material may contain at least one selected from the group consisting of 10% by mass or less of Bi in terms of $Bi_2O_3$, 5% by mass or less of Na in terms of $Na_2O$, and 5% by mass or less of K in terms of $K_2O$, based on 100% by mass of the main components.

Cu or Mn is preferably added to the first insulating material so that the Sr anorthite crystal precipitation temperature can be lowered. For this purpose, the first insulating material may contain at least one of 5% by mass or less of Cu in terms of CuO and 5% by mass or less of Mn in terms of $MnO_2$, based on 100% by mass of the main components.

In the invention, the raw materials for the low-temperature sintered material should be as free of $B_2O_3$ as possible, though $B_2O_3$ is used for some conventional LTCC substrates. For this purpose, the content of B in terms of $B_2O_3$ is preferably 0.5% by mass or less, more preferably 0.1% by mass or less, based on 100% by mass of the total amount of the first insulating material. $B_2O_3$ is disadvantageous in that it can dissolve in water or an alcohol during the manufacturing process, segregate during drying, react with electrode materials during sintering, or react with the organic binder used so that it can degrade the performance of the binder. However, reducing the B content to the above range can prevent the problems with the manufacturing process.

The respective raw materials for the low-temperature sintered material may be provided in the form of, for example, oxides or carbonates, which may be combined freely in such a manner that the contents of the main components and the sub-components can fall within the above ranges.

In the invention, the first insulating material is preferably obtained by weighing each raw material, then mixing the raw materials, drying the mixture, and calcining the resulting dried powder. The raw materials may be mixed using any known mixing method. In view of uniformity, for example, the raw materials and ion-exchanged water are preferably added to a ball mill containing zirconia balls and mixed under wet conditions for 10 to 30 hours to form a slurry.

A water-soluble organic binder such as polyvinyl alcohol (PVA) may be added to the slurry, and then the mixture may be subjected to a known drying method. For example, the mixture may be spray-dried in a spray dryer so that the mixture of the raw materials can be obtained in the form of granules with a diameter of about 50 to about 100 μm.

The raw material granules obtained after the drying may be calcined to form the first insulating material. The calcination may be performed using a known firing method. For example, the calcination is preferably performed in such a manner that the granules are kept at 850° C. or lower for 1 to 3 hours in the air in a firing furnace under such conditions that $SiO_2$ is partially converted into glass. The granules are preferably fired at a calcination temperature of 750 to 850° C. A ground powder is obtained by grinding the resulting calcined product. The resulting ground powder preferably has a BET specific surface area of 10 to 20 m$^2$/g so that it allows the first ceramic layer to have a dense structure and improved dielectric characteristics during firing. The first insulating material obtained through the calcination in this way includes $Al_2O_3$ as a main phase. The first insulating material may contain an oxide with a dielectric constant higher than that of $Al_2O_3$, such as $Mg_2SiO_4$, $ZrO_2$, $BaTiO_3$, or $TiO_2$. In such a case, such an oxide may form the main phase if its content is high. The first insulating material may be a calcined product obtained by calcining a mixture of oxides or carbonates of Al, Si, and Sr. Alternatively, the first insulating material may be a calcined product mixture obtained by mixing the calcined product and an oxide dielectric with a dielectric constant higher than that of $Al_2O_3$.

The first ceramic layer obtained by firing (sintering) the first insulating material by the method described below includes Sr anorthite and $Al_2O_3$ or an oxide dielectric with a dielectric constant higher than that of $Al_2O_3$. The oxide dielectric with a dielectric constant higher than that of $Al_2O_3$ preferably includes an oxide such as $Mg_2SiO_4$, $ZrO_2$, $BaTiO_3$, or $TiO_2$.

The first ceramic layer preferably contains 40 to 50% by mass of Al in terms of $Al_2O_3$, 30 to 40% by mass of Si in terms of $SiO_2$, and 10 to 20% by mass of Sr in terms of $SrCO_3$. The first ceramic layer has an $Al_2O_3$ content higher than that in the stoichiometric composition of $SrAl_2Si_2O_8$ ($Al_2O_3$ 31.30% by mass, $SiO_2$ 36.89% by mass, SrO 31.81% by mass). Therefore, the first ceramic layer can contain an $Al_2O_3$ crystal phase and an $SrAl_2Si_2O_8$ crystal phase, which can provide high dielectric constant and form strong interface bonding. The first ceramic layer preferably contains 0.5% by mass or less of B in terms of $B_2O_3$.

In order to prevent delamination and cracking, the first ceramic layer preferably has a thermal expansion coefficient of $4 \times 10^{-6}$ to $8 \times 10^{-6}$/° C.

To have a higher dielectric constant, the first ceramic layer preferably contains a main phase of $Al_2O_3$ or an oxide dielectric with a dielectric constant higher than that of $Al_2O_3$. In particular, $Al_2O_3$ is more preferred because it has high strength and thus can form a substrate with higher transverse strength.

Next, a second insulating material used to form the second ceramic layer will be described. The second insulating material used to from the second ceramic layer includes a powder of a mixture of at least glass capable of forming Sr anorthite; and cordierite. The glass capable of forming Sr anorthite can be obtained similarly to that in the first insulating material by calcining raw materials including, for example, oxides or carbonates of Al, Si, and Sr. Hereinafter, a repeated description of the same features as those of the first insulating material may be omitted as appropriate.

The second insulating material preferably contains 10 to 20% by mass of Al in terms of $Al_2O_3$, 50 to 65% by mass of Si in terms of $SiO_2$, and 20 to 30% by mass of Sr in terms of $SrCO_3$ so that $SrAl_2Si_2O_8$ can be formed as a main phase by firing the second insulating material. The second insulating material should have an Al content lower than that of the first insulating material, so that a higher $SrAl_2Si_2O_8$ phase content can be achieved to provide a lower dielectric constant.

In addition to the main components mentioned above, the second insulating material may contain, for example, Bi, Na, K, Cu, or Mn as a sub-component.

Similarly to the process for the first insulating material, a powder is calcined, which is obtained by weighing the respective raw materials, then mixing the raw materials, and drying the mixture. The resulting calcined product has a $SiO_2$ crystal phase and an $Al_2O_3$ crystal phase, in which $Al_2O_3$ is the main phase. A silicate mineral cordierite represented by the composition $2MgO.2Al_2O_3.5SiO_2$ is added to the calcined product, and then the resulting mixture is ground. The $2MgO.2Al_2O_3.5SiO_2$ material is not limited and may be any of a natural product and a synthetic product. A commercially available product produced by a known method may also be directly used as the 2MgO.2Al$_2$O$_3$.5SiO$_2$ material. Before use, a commercially available product may also be ground to a median diameter D50 of, for example, 1 to 3 μm. Alternatively, the 2MgO.2Al$_2$O$_3$.5SiO$_2$ material may be produced by mixing the respective raw material powders containing Si, Al, and Mg, respectively, in a stoichiometric ratio or other ratios, firing the mixture at 1,300° C. to 1,400° C. by a known method, and grinding the fired product to form a fine powder. As used herein, the term "median diameter D50" refers to the particle size corresponding to a cumulative volume fraction of 50% in the curve showing the relationship between the particle size and the cumulative volume (the value obtained by summing the volumes of particles with particle sizes equal to and lower than a specific particle size).

The calcined product and the 2MgO.2Al$_2$O$_3$.5SiO$_2$ material are ground under wet conditions to form a mixture powder. The step of grinding the mixture may be performed using any grinding means capable of forming a mixture powder with a median diameter D50 of less than 1 μm. A ball mill is preferred as a machine suitable for wet grinding. For example, the calcined product, the 2MgO.2Al$_2$O$_3$.5SiO$_2$ material, and an organic solvent such as ethanol or butanol may be added to a ball mill containing zirconia balls and ground under wet conditions for 15 to 20 hours, so that a mixture powder with a desiredparticle size can be obtained. The mixture powder preferably has a BET specific surface area of 10 to 20 m$^2$/g so that it can form a dense structure and provide improved dielectric characteristics during sintering.

The mixture powder preferably contains 20 to 35% by mass of the 2MgO.2Al$_2$O$_3$.5SiO$_2$ material and 65 to 80% by mass of the calcined product based on 100% by mass of the total amount of the calcined product and the 2MgO.2Al$_2$O$_3$.5SiO$_2$ material. When the contents of the materials fall within these ranges, the resulting dielectric ceramic can have a desired level of dielectric characteristics such as dielectric constant at high frequencies in the microwave band. The second insulating material obtained through the calcination in this way can contain a main phase of Al$_2$O$_3$ or a main phase of 2MgO.2Al$_2$O$_3$.5SiO$_2$ depending on the content of the 2MgO.2Al$_2$O$_3$.5SiO$_2$ material. The second insulating material may be a calcined product mixture of a cordierite powder and a calcined product obtained by calcining a mixture of oxides or carbonates of Al, Sr, and Sr.

The second ceramic layer obtained by firing (sintering) the second insulating material by the method described below includes Sr anorthite and cordierite and has a dielectric constant lower than that of the first ceramic layer. As used herein, the term "cordierite" refers to a silicate mineral typically represented by the composition 2MgO.2Al$_2$O$_3$.5SiO$_2$. The cordierite has the following chemical composition: SiO$_2$ 42-56% by mass, Al$_2$O$_3$ 30-45% by mass, MgO 12-16% by mass, in which MgO, Al$_2$O$_3$, or SiO$_2$ may be in excess of the stoichiometric composition of cordierite. It will be understood that the cordierite may contain impurities derived from raw materials (inevitable impurities).

The second ceramic layer preferably contains 10 to 30% by mass of Al in terms of Al$_2$O$_3$, 50 to 65% by mass of Si in terms of SiO$_2$, and 20 to 30% by mass of Sr in terms of SrCO$_3$. The second ceramic layer may have an Al content lower than that of the first ceramic layer and thus have a higher content of the Sr anorthite phase as the common phase, which can make the contraction behavior of the second ceramic layer close to that of the first ceramic layer during firing and thus make it possible to prevent delamination and cracking.

Similarly to the first ceramic layer, the second ceramic layer in the invention preferably contains 0.5% by mass or less of B in terms of B$_2$O$_3$ and more preferably contains 0.1% by mass or less of B in terms of B$_2$O$_3$. When the amount of use of B is kept low, problems with the manufacturing process can be prevented, such as damage to firing furnace materials and dissolution of B in water or an alcohol and segregation of B during drying in the process of forming the inorganic composition into ceramic sheets.

In order to prevent delamination and cracking, the second ceramic layer preferably has a thermal expansion coefficient similar to that of the first ceramic layer, and specifically, the second ceramic layer preferably has a thermal expansion coefficient of $4 \times 10^{-6}$ to $8 \times 10^{-6}$/° C.

In view of dielectric constant and prevention of delamination and cracking, the second ceramic layer preferably has a Sr anorthite phase as a main phase.

The resulting first and second insulating materials are each formed into a layer. Specifically, a layer of the first insulating material and a layer of the second insulating material are formed, respectively, in which the first insulating material includes a powder of a mixture of at least glass capable of forming Sr anorthite; and Al$_2$O$_3$ or an oxide dielectric with a dielectric constant higher than that of Al$_2$O$_3$, and the second insulating material includes a powder of a mixture of at least glass capable of forming Sr anorthite; and cordierite. The layers may be formed by a known method such as a printing method, an inkjet method, a coating method, a transfer method, a calender roll method, or a doctor blade method. For example, a solvent, an organic binder, and a plasticizer are added to the ground powder, and then they are dispersed to form a slurry, which is formed into a sheet by a doctor blade method. The organic binder may be of any known conventional type. The organic binder may be, for example, polyvinyl butyral (PVB) in view of the strength, the ability to be via-formed, the ability to be pressure-bonded, and the dimensional stability with respect to a ceramic green sheet obtained by forming the material into a sheet. The plasticizer may be of any known conventional type, such as butyl phthalyl butyl glycolate (BPBG), dibutyl phthalate (DBP), or dioctyl phthalate (DOP). The solvent used is preferably an organic solvent such as ethanol, butanol, toluene, or isopropyl alcohol.

The slurry may be subjected to degassing under vacuum, and volatile components such as the organic solvent and the air entrained during the degassing may be evaporated, so that the slurry can be adjusted to a predetermined concentration or viscosity. The adjusted viscosity is preferably from 8,000 to 10,000 cP. Subsequently, the mixture powder in the form of the slurry may be formed into a ceramic green sheet with a thickness of 20 to 250 μm on a carrier film by a known sheet-forming technique such as a doctor blade method. In view of mechanical strength, surface smoothness, and other properties, the carrier film is preferably a resin film such as a polyethylene terephthalate (PET) film. Subsequently, the sheet may be directly cut into pieces of a predetermined size without being separated from the carrier film, so that a plurality of ceramic green sheets can be obtained.

The organic solvent-containing slurries obtained by the wet grinding may be subjected to a sheet-forming process, respectively, to form a ceramic green sheet of the first insulating material and a ceramic green sheet of the second insulating material. The ceramic green sheet as formed by a doctor blade method is supported on a resin film such as a PET film. Via holes may be formed in the ceramic green sheet in such a state. Any known method may be used to form via holes. For example, the ceramic green sheet may be punched with a punching die having a plurality of punching pins, or via holes may be formed by perforating the ceramic green sheet by laser machining. The size of the via holes is preferably, for example, 30 to 80 μm in diameter.

Subsequently, the ceramic green sheet and a screen mask may be placed in a printing machine, where the via holes formed in the ceramic green sheet may be filled with a conductor paste by printing, and a conductor pattern such as wiring (wiring pattern) may be formed on the ceramic green sheet by printing. The conductor paste may be a known conductor paste. In view of resistivity, for example, a Ag paste or a Cu paste may be used as the conductor paste.

The ceramic green sheets may be stacked to forma laminate including the first and second insulating materials arranged in layers. In other words, a layer of the first insulating material and a layer of the second insulating material may be stacked to form a laminate. In addition, a composite ceramic green sheet may be formed by hollowing part of the ceramic green sheet of one insulating material and then filling the hollow with the other insulating material, or a composite ceramic green sheet may be formed by printing one insulating material on part of the ceramic green sheet of the other insulating material. The ceramic green sheet may also have a partial region with a dielectric constant different from that of the other region.

The resin film may be removed from each ceramic green sheet, and a plurality of the ceramic green sheets may be stacked. The stack of the ceramic green sheets may be 0.2 to 1.5 mm in thickness, which may include 5 to 20 stacked green sheet layers each with a thickness of 10 to 200 μm. The number of layers to be stacked (the number of stacks) and other conditions may be freely selected depending on the desired thickness of the ceramic substrate. The ceramic green sheets may be arranged in such a manner that via wiring parts overlap one another, and then a pressure may be applied in the thickness direction to the sheets using a press machine. In this process, a laminate is preferably formed by pressure-bonding the stacked ceramic green sheets at a binder-softening temperature such as a temperature of 60 to 90° C. with a pressure of 1 to 30 MPa applied for 100 seconds to 30 minutes. More preferably, a laminate is formed by placing the stack in a die composed of a metal frame and a pair of metal plates, then sealing the stack with a resin film, and then pressing the stack by CIP (with a hydrostatic isotropic press).

Subsequently, the laminate may be subjected to debinding and firing, in which Sr anorthite is produced by firing. In the firingprocess, the temperature is first preferably increased at a rate of 10 to 20° C. per hour from about 200° C., at which the binder starts to undergo thermal decomposition, to about 600° C., at which the thermal decomposition is completed, in order to prevent delamination of the ceramic green sheets, which would otherwise be caused by the pressure of generated gas. The debinding may be performed under a nitrogen atmosphere. Preferably, the debinding is performed while a sufficient amount of air is supplied and discharged in order to facilitate the decomposition and oxidation of the organic binder and to facilitate the removal of $CO_2$ gas and gas generated by the decomposition. At 600° C. or higher, the content of organic materials reaches at most about 0.05% by mass. Therefore, from 600° C., the firing (sintering) may be performed by, for example, increasing the temperature at a rate of 150 to 250° C. per hour to 1,000° C. or lower (e.g., 900° C.) in the air or an $N_2$ atmosphere and then maintaining the reached temperature for 1 to 3 hours, so that a ceramic substrate including a composite of first and second ceramic layers with different dielectric constants can be obtained by converting the first and second insulating materials into dielectric ceramics with different dielectric constants. In this process, Sr anorthite should be strongly bonded while being formed. For this purpose, the firing (sintering) should preferably be performed at 800 to 1,000° C.

The ceramic substrate of the invention includes a first ceramic layer including Sr anorthite and $Al_2O_3$ or an oxide dielectric with a dielectric constant higher than that of $Al_2O_3$; and a second ceramic layer including Sr anorthite and cordierite and having a dielectric constant lower than that of the first ceramic layer. Therefore, when semiconductor devices, inductances, and reactance elements such as capacitors are mounted on the ceramic substrate of the invention, low melting point metals such as Ag and Cu can be used to form wiring for connecting the semiconductor devices and other components and to form electrodes, while different dielectric constants are maintained in the ceramic substrate. $SrAl_2Si_2O_8$ is formed as a common crystal phase in the first and second ceramic layers by the firing, so that the first and second ceramic layers can be strongly bonded together with less delamination and cracking at the bonded interface between the first and second ceramic layers.

In the ceramic substrate of the invention, the absolute value of the difference between the thermal expansion coefficients of the first and second ceramic layers is preferably $1\times10^{-6}/°$ C. or less, more preferably $0.5\times10^{-6}/°$ C. or less. In addition, the first and second ceramic layers preferably have close contraction behaviors during firing (close contraction starting temperatures and close contraction ending temperatures). Specifically, the difference between their contraction starting temperatures and the difference between their contraction ending temperatures are preferably within ±25° C. This makes it possible to suppress delamination and cracking even when thermal expansion difference-induced stress occurs at the bonded interface between the first and second ceramic layers in the process of mounting semiconductors and chip parts on the ceramic substrate by reflow soldering or the like, which induces rapid thermal changes. For the retention of dielectric characteristics, the ceramic substrate of the invention preferably has an fQ product of 10 THz or more, more preferably more than 10 THz, at a frequency of 15 GHz.

The ceramic substrate of the invention preferably has a porosity of 1.0% or less, more preferably 0.8% or less, even more preferably 0.7% or less. This feature makes it easy to obtain the desired dielectric characteristics.

EXAMPLES

Hereinafter, the invention will be described in detail with reference to examples. It will be understood that the examples below are not intended to limit the gist of the invention. First, the measurement conditions and methods, and other conditions will be described together for various items evaluated in the examples.

<Evaluations>

(1) Dielectric Constant and fQ Product

The dielectric characteristics were evaluated by dielectric resonator method (according to JIS R 1627) using a network analyzer (872D manufactured by Hewlett-Packard Company). The resonance frequency f and no-load Q value of a sample with a predetermined shape (11 mm in diameter, 5.5 mm in thickness) were measured, from which the fQ product was calculated, and the dielectric constant of the sample was calculated from the relationship between f and the dimensions of the sample. The dimensions were so selected as to achieve a resonance frequency of 15 GHz.

(2) Temperature Characteristic τf of Resonance Frequency

The sample for item (1) was used in the measurement of the resonance frequency in the temperature range of −20 to 60° C., from which the temperature characteristic τf was calculated based on the resonance frequency at 20° C.

(3) X-ray Diffraction Intensity

X-ray diffractometry (XRD) was performed using a multifunctional X-ray diffractometer MRD (manufactured by Spectris Co., Ltd.) with Cu-Kα as a ray source.

(4) Density

The density was calculated from the outer diameter, thickness, and mass of the sample.

(5) Thermal Expansion Coefficient

After the upper and lower surfaces of a sintered product with a diameter of 5 mm and a height of 10 mm was figured, the sintered product was subjected to thermal mechanical analysis (TMA) measurement at a rate of temperature increase of 600° C./hour, from which the thermal expansion coefficient was calculated in the range of 40 to 400° C.

(6) Transverse Strength

Ten layers each having 110-μm-thickness of green sheet produced with each of the first and second insulating materials were stacked and then subjected to CIP (with a hydrostatic isotropic press) at 85° C. with a pressure of 30 MPa applied for 30 minutes to form a green sheet laminate. Subsequently, each green sheet laminate was cut so as to form 36-mm-long, 12-mm-wide, 1-mm-thick pieces after firing. Subsequently, the cut pieces were fired at 900° C. for 2 hours and then subjected to C chamfering. The resulting chamfered samples were subjected to the measurement of transverse strength (according to JIS R1601). The top five and bottom five values are excluded from the measurements of the samples (n=20), and the average of the ten measurements (n=10) is indicated.

(7) Vickers Hardness

The surface of the fired sample to be measured was subjected to mirror polishing and then subjected to the measurement of Vickers hardness based on JIS Z 2244 (test force 1.961 N (HV 0.2)).

(8) Contraction Starting and Ending Temperatures During Firing

A sample formed with a 5.5-mm-diameter, 12-mm-height shape was subjected to TMA at a rate of temperature increase of 10° C./minute, in which the contraction starting and ending temperatures were determined from intercepts at points of variation of the resulting contraction curve.

(9) Optical Microscope (Porosity) and Scanning Electron Microscope (Delamination and Cracking)

The resulting ceramic substrate was cut in the thickness direction. The resulting cross-section was subjected to mirror polishing and then observed with a microscope at a magnification of 100. In addition, the image was subjected to binarization, in which the pore portions of the image were black whereas the non-pore portions were white, and the area ratio of the black portions was calculated using image analysis software (ImageJ). Specifically, the porosity (%) in the area of the field of view was calculated by dividing the measured area of the pore portions by the total area of the field of view. After a process similar to the above, delamination and cracking at the bonded interface between the first and second ceramic layers were observed with a scanning electron microscope at a magnification of 2,000.

Example 1

<Preparation of Ceramic Substrate>

A first insulating material was prepared, which was to be fired to form a first ceramic layer. Raw materials, 50 kg in total mass, were weighed and mixed to form a composition of 45.5% by mass of $Al_2O_3$, 32.5% by mass of $SiO_2$, 13.0% by mass of $SrCO_3$, 3.5% by mass of $TiO_2$, 2.3% by mass of $Bi_2O_3$, 2.4% by mass of $Na_2CO_3$, 0.3% by mass of CuO, and 0.5% by mass of $Mn_3O_4$ (100% by mass in total). The resulting mixed powder was placed in a firing setter and calcined in the air in the firing furnace at a temperature of 800° C. for 2 hours to form a calcined product. The resulting calcined product was ground to give a first insulating material. Crystal phases were identified by X-ray diffraction analysis of the first insulating material. Peaks indicating the presence of $Al_2O_3$ and $SiO_2$ were observed in the X-ray diffraction pattern, and it was determined from the peak intensities that $Al_2O_3$ was the main phase. In addition, $SrAl_2Si_2O_8$ was not identified.

A second insulating material was prepared, which was to be fired to form a second ceramic layer. Raw materials, 50 kg in total mass, were weighed and mixed to form a composition of 15.0% by mass of $Al_2O_3$, 53.8% by mass of $SiO_2$, 21.2% by mass of $SrCO_3$, 3.4% by mass of $Bi_2O_3$, 4.6% by mass of $Na_2CO_3$, 1% by mass of $K_2CO_3$, 0.4% by mass of CuO, and 0.6% by mass of $Mn_3O_4$ (100% by mass in total). The resulting mixed powder was placed in a firing setter and calcined in the air in the firing furnace at a temperature of 775° C. for 2 hours to form a calcined product. Like the first insulating material, peaks indicating the presence of $Al_2O_3$ and $SiO_2$ were observed in the X-ray diffraction pattern of the calcined product, and it was determined from the peak intensities that $Al_2O_3$ was the main phase. In addition, $SrAl_2Si_2O_8$ was not identified. A second insulting material was prepared by mixing 70% by mass of the resulting calcined product and 30% by mass of a commercially available $2MgO.2Al_2O_3.5SiO_2$ material (purity: 97.5%, median diameter D50: 1.65 μm, BET: 6.3 m$^2$/g), grinding them under wet conditions in a ball mill, and then drying the ground mixture. Peaks indicating the presence of $Al_2O_3$, $SiO_2$, and $2MgO.2Al_2O_3.5SiO_2$ were observed in the X-ray diffraction pattern of the second insulating material, and it was determined from the peak intensities that $Al_2O_3$ was the main phase.

A binder (PVA) was added to each of the resulting first and second insulating materials and mixed therewith. Each mixture was sieved with a mesh to give a granulated powder, which was packed into a die to form a molded product. The shape and dimensions of each molded product were according to those shown for the respective measurement items in the evaluation section above. Each molded product was fired at a temperature of 900° C. for 2 hours to form each dielectric ceramic. Each resulting dielectric ceramic was evaluated for density, dielectric constant, fQ product, temperature characteristic τf of resonance frequency, thermal expansion coefficient, and other characteristics. Table 1 shows the results.

TABLE 1

|  | Dielectric ceramic (first ceramic layer) made from first insulating material | Dielectric ceramic (second ceramic layer) made from second insulating material |
|---|---|---|
| Dielectric constant $\varepsilon r$ | 8.1 | 6.0 |
| fQ product | 13 THz | 11 THz |
| Temperature coefficient $\tau f$ of resonance frequency | $-17.0 \times 10^{-6}/°$ C. | $-18.1 \times 10^{-6}/°$ C. |
| Sintered density | $3.20 \times 10^3$ kg/m$^3$ | $2.75 \times 10^3$ kg/m$^3$ |
| Thermal expansion coefficient | $5.3 \times 10^{-6}/°$ C. | $5.6 \times 10^{-6}/°$ C. |
| Contraction starting and ending temperatures during firing | Starting 732° C., ending 852° C. | Starting 757° C., ending 847° C. |
| Vickers hardness | 771 | 666 |
| Porosity | 0.03% | 0.67% |

The respective dielectric ceramics had a dielectric constant of 8.1 (first ceramic layer) and a dielectric constant of 6.0 (second ceramic layer) at 15 GHz. Both of the respective dielectric ceramics had an fQ product of at least 10 THz. The difference in thermal expansion coefficient between the respective dielectric ceramics was at most $1 \times 10^{-6}/°$ C., and the difference between the contraction starting and ending temperatures during the firing was also small and within ±25° C. As a result of the X-ray diffractometry of the respective dielectric ceramics, the dielectric ceramic made from the first insulating material was found to contain $Al_2O_3$, $SiO_2$, $SrAl_2Si_2O_8$, $TiO_2$, and other components. An $Al_2O_3$ diffraction peak appeared higher than other crystal phase peaks, which showed that $Al_2O_3$ was the main phase of the dielectric ceramic. The dielectric ceramic made from the second insulating material was found to contain $Al_2O_3$, $SiO_2$, $SrAl_2Si_2O_8$, $2MgO·2Al_2O_3·5SiO_2$, and other components. An $SrAl_2Si_2O_8$ diffraction peak appeared higher than other crystal phase peaks, which showed that $SrAl_2Si_2O_8$ was the main phase.

A solvent (ethanol), a plasticizer (DOP), and a binder (PVB) were added to each of the first and second insulating materials. Each mixture was stirred to form a dispersion. Each dispersion was subjected to degassing under vacuum, and volatile components such as the organic solvent and the air entrained during the degassing were evaporated, so that a slurry with an adjusted viscosity was obtained. Each degassed slurry was formed into a 50-μm-thick ceramic green sheet by a doctor blade method.

Laser machining was performed to form via holes in each ceramic green sheet, which was supported on a PET resin film.

Subsequently, each ceramic green sheet and a screen mask were placed in a printing machine, where the via holes formed in the ceramic green sheet was filled with a conductor paste by printing using a squeegee, and a conductor pattern such as wiring was formed on the ceramic green sheet by printing. The conductor paste used was a Ag paste.

Subsequently, the resin film was removed from each ceramic green sheet, and then a plurality of the ceramic green sheets were stacked. The ceramic green sheets were fixed with a pressure-sensitive adhesive sheet to a press machine, and so arranged that via wiring portions overlapped one another. A stack of the ceramic green sheets was obtained by applying a pressure in the vertical direction to the arranged ceramic green sheets. The resulting stack was subjected to cold isostatic pressing (CIP) at a binder-softening temperature, 85° C., with a pressure of 15 MPa applied for 30 minutes so that the ceramic green sheets were pressure-bonded to form a laminate (1.5 mm in thickness).

Figure 2:
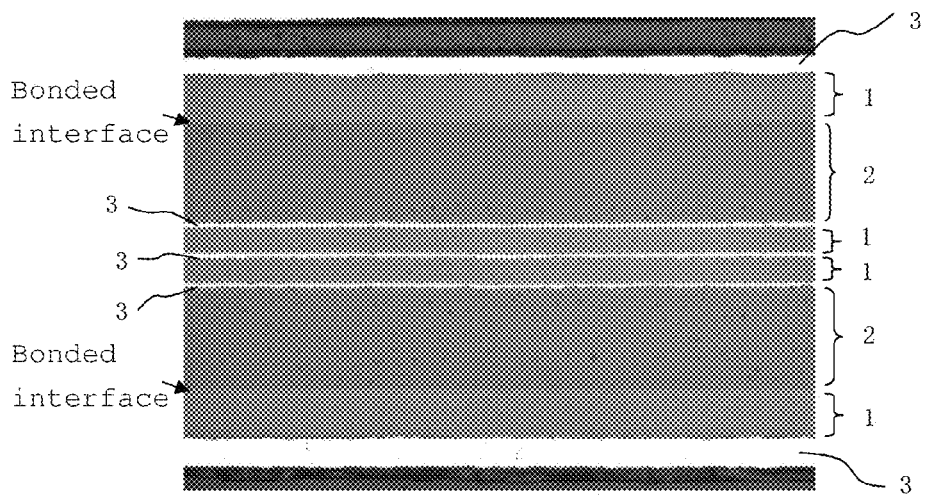
FIG. 2 is a photograph showing an observed cross-section of a ceramic substrate according to Example 1 of the invention.

Subsequently, the laminate was fired to form a ceramic substrate. The firing was performed by degreasing at 600° C. and then holding in the air at 900° C. for about 2 hours. The resulting ceramic substrate was cut in the thickness direction. The resulting cross-section was subjected to mirror polishing and then observed with an optical microscope at a magnification of 100. FIG. 2 shows a photograph of the observed cross-section. The ceramic substrate shown in FIG. 2 includes, in order from the lower side, two stacked 40-μm-thick first ceramic layers of the dielectric ceramic made from the first insulating material, following three stacked 40-μm-thick second ceramic layers of the dielectric ceramic made from the second insulating material, an intermediate Ag electrode, a first ceramic layer stacked thereon, another intermediate Ag electrode, a first ceramic layer stacked thereon, a further intermediate Ag electrode, following three stacked second ceramic layers, and following two stacked first ceramic layers. Ag electrodes are formed on the upper and lower surfaces of the ceramic substrate, which correspond to the upper and lower sides of the cross-sectional view.

As a result of observation with a scanning electron microscope at a magnification of 2,000, no delamination or cracking was observed at the bonded interface between the first and second ceramic layers, and they were found to be strongly bonded together. No delamination or cracking was also observed at the bonded interface between the first ceramic layer and the Ag electrode or at the bonded interface between the second ceramic layer and the Ag electrode.

Only ten 110-μm-thick ceramic green sheets made from the first insulating material were stacked and subjected to CIP at 85° C. with a pressure of 30 MPa applied for 30 minutes to form a laminate, which was cut so as to form 36-mm-long, 12-mm-wide, 1-mm-thick pieces after firing. Subsequently, the cut pieces were fired at 900° C. for 2 hours and then subjected to C chamfering, resulting in samples for evaluation of transverse strength. Similarly, only ten ceramic green sheets made from the second insulating material were stacked and used to form samples for evaluation of transverse strength, which were made of the second ceramic layers. In addition, only five ceramic green sheets made from the first insulating material were stacked, on which only five ceramic green sheets made from the second insulating material were then stacked. The resulting stack was used to form samples for evaluation of transverse strength, which were made of a composite of the first and second ceramic layers. Each sample for evaluation of transverse strength was subjected to the measurement of transverse strength using the evaluation method described above. As a result, the samples made of only the first ceramic layers had a transverse strength of 300 MPa, and the samples made of only the second ceramic layers had a transverse strength of 199 MPa. On the other hand, the samples made of a composite of the first and second ceramic layers had a transverse strength of 260 MPa.

Comparative Example 1

A second insulating material was prepared, which was to be fired to form a second ceramic layer. Raw materials, 50 kg in total mass, were weighed and mixed to form a composition of 15.0% by mass of $Al_2O_3$, 53.8% by mass of $SiO_2$, 21.2% by mass of $SrCO_3$, 3.4% by mass of $Bi_2O_3$, 4.6% by mass of $Na_2CO_3$, 1% by mass of $K_2CO_3$, 0.4% by mass of CuO, and 0.6% by mass of $Mn_3O_4$ (100% by mass in total). The resulting mixed powder was placed in a firing setter and calcined in the air in the firing furnace at a temperature of 775° C. for 2 hours to form a calcined product. Like the first insulating material, peaks indicating the presence of $Al_2O_3$ and $SiO_2$ were observed in the X-ray diffraction pattern of the calcined product, and it was determined from the peak intensities that $Al_2O_3$ was the main phase. In addition, $SrAl_2Si_2O_8$ was not identified. A second insulting material was prepared by mixing 86% by mass of the resulting calcined product and 14% by mass of commercially available quartz $SiO_2$ (purity: 99.8%), grinding them under wet conditions in a ball mill, and then drying the ground mixture. The X-ray diffraction pattern of the second insulating material showed that $SiO_2$ was the main phase.

A binder (PVA) was added to the resulting second insulating material and mixed therewith. The mixture was sieved with a mesh to give a granulated powder, which was packed into a die to form a molded product. The shape and dimensions of the molded product were according to those shown for the respective measurement items in the evaluation section above. The molded product was fired at a temperature of 900° C. for 2 hours to form a dielectric ceramic. The resulting dielectric ceramic was evaluated for density, dielectric constant, fQ product, temperature characteristic τf of resonance frequency, thermal expansion coefficient, and other characteristics. Table 2 shows the results.

TABLE 2

|  | Dielectric ceramic (second ceramic layer) made from second insulating material |
|---|---|
| Dielectric constant ∈r | 5.7 |
| fQ product | 10 THz |
| Temperature coefficient τf of resonance frequency | $-4.8 \times 10^{-6}/°$ C. |
| Sintered density | $2.74 \times 10^3$ kg/m$^3$ |
| Thermal expansion coefficient | $10.7 \times 10^{-6}/°$ C. |
| Contraction starting and ending temperatures during firing | Starting 733° C., ending 848° C. |
| Vickers hardness | 639 |
| Porosity | 1.27% |

The dielectric ceramic made from the second insulating material was found to contain $Al_2O_3$, $SiO_2$, $SrAl_2Si_2O_8$, and other components. An $SrAl_2Si_2O_8$ diffraction peak appeared higher than other crystal phase peaks, which showed that $SrAl_2Si_2O_8$ was the main phase.

Samples for evaluation of transverse strength were also prepared as in Example 1. The transverse strength of the samples was measured by the above evaluation method. Aa a result, the samples made of only the second ceramic layers of Comparative Example 1 had a transverse strength of 210 MPa.

The first insulating material obtained in Example 1 and the second insulating material obtained in Comparative Example 1 were used to form a ceramic substrate in a similar manner to Example 1. As a result of observation with a scanning electron microscope at a magnification of 2,000, cracking was observed in two of five samples. In two of five samples, delamination was also observed at the bonded interface between the first ceramic layer and the Ag electrode or at the bonded interface between the second ceramic layer and the Ag electrode. The first insulating material obtained in Example 1 and the second insulating material obtained in Comparative Example 1 seem to be similar in contraction behavior (contraction starting and ending temperatures). However, the second insulating material obtained in Comparative Example 1 seems to be more likely to cause cracking or delamination because it significantly differs in thermal expansion coefficient from the first insulating material and contracts at a higher percentage during firing.

What is claimed is:

1. A ceramic substrate comprising:
   a first ceramic layer comprising Sr anorthite and at least one component selected from the group consisting of (i) $Al_2O_3$ and (ii) an oxide dielectric with a dielectric constant higher than that of $Al_2O_3$; and
   a second ceramic layer comprising Sr anorthite and cordierite and having a dielectric constant lower than that of the first ceramic layer;
   wherein at least one of said layers of the ceramic substrate has an fQ product of 10 THz or more at a frequency of 15 GHz.

2. The ceramic substrate according to claim 1, wherein the absolute value of a difference in thermal expansion coefficient between the first ceramic layer and the second ceramic layer is $1 \times 10^{-6}/°$ C. or less.

3. The ceramic substrate according to claim 1, wherein the first ceramic layer and the second ceramic layer contains 0.5% by mass or less of B in terms of $B_2O_3$.

4. The ceramic substrate according to claim 1, wherein the first ceramic layer has a dielectric constant of 7 or more, and the second ceramic layer has a dielectric constant of 6.5 or less.

5. The ceramic substrate according to claim 1, wherein the first ceramic layer is produced from a composition that contains 40 to 50% by mass of Al in terms of $Al_2O_3$, 30 to 40% by mass of Si in terms of $SiO_2$, and 10 to 20% by mass of Sr in terms of $SrCO_3$.

6. The ceramic substrate according to claim 1, wherein the first ceramic layer has a main phase of $Al_2O_3$ or the oxide dielectric with a dielectric constant higher than that of $Al_2O_3$, and the second ceramic layer has a main phase of Sr anorthite.

7. The ceramic substrate according to claim 1, wherein the first ceramic layer has an fQ product of at least 13 THz.

8. The ceramic substrate according to claim 1, wherein the second ceramic layer has an fQ product of at least 11 THz.

9. The ceramic substrate according to claim 1, wherein the first ceramic layer has an fQ product of at least 13 THz and the second ceramic layer has an fQ product of at least 11 THz.

* * * * *